United States Patent [19]

Uijen

[11] 4,009,540
[45] Mar. 1, 1977

[54] METHOD OF WORKING FLAT ARTICLES
[75] Inventor: Antonius Johannes Mathijs Uijen, Nijmegen, Netherlands
[73] Assignee: U.S. Philips Corporation, New York, N.Y.
[22] Filed: Mar. 25, 1975
[21] Appl. No.: 561,938
[30] Foreign Application Priority Data Apr. 1, 1974 Netherlands .................... 7404364

[52] U.S. Cl. .......................... 51/283; 51/216 LP; 51/235; 51/323
[51] Int. Cl.² .................................. B24B 41/00
[58] Field of Search ............ 51/235, 216 LP, 283, 51/284 R, 323; 269/21

[56] References Cited
UNITED STATES PATENTS

| | | | |
|---|---|---|---|
| 2,353,066 | 7/1944 | Phillips | 51/235 |
| 2,443,987 | 6/1948 | Morrison | 51/235 X |
| 2,855,653 | 10/1958 | Kastenbein | 51/235 UX |
| 3,004,766 | 10/1961 | Bryant | 51/235 X |
| 3,131,476 | 5/1964 | Seher | 51/235 X |
| 3,330,714 | 7/1967 | Gunderson | 269/21 X |
| 3,681,139 | 8/1972 | Jannett | 51/235 X |
| 3,740,900 | 6/1973 | Youmans | 51/235 |
| 3,809,050 | 5/1974 | Chough | 51/235 X |

Primary Examiner—Harold D. Whitehead
Assistant Examiner—Robert C. Watson
Attorney, Agent, or Firm—Frank R. Trifari; Ronald L. Drumheller

[57] ABSTRACT

An article, for example a semiconductor wafer, is temporarily secured to a support without using a cement so that a treatment such as polishing may be carried out. The support has at least one recess and the article is positioned on the recess. The support with the article are then placed in a space in which sub-atmospheric pressure is produced so that gas escapes from the recess. When the sub-atmospheric pressure in the space is removed, the article closes the recess so that sub-atmospheric pressure is maintained there resulting in temporary adhesion of the article to the support.

9 Claims, 4 Drawing Figures

METHOD OF WORKING FLAT ARTICLES

The invention relates to a method of working a surface of an article, in particular polishing a semiconductor wafer, in which the article is connected with one of its surfaces to a corresponding connection surface of a support, is subjected to a treatment and is removed from the support.

In polishing or lapping one side of, for example, semiconductor wafers, it is common practice to provide the semiconductor wafers on a support by means of a thin layer of wax or cement. Said known connection method exhibits a number of drawbacks. As a result of the non-uniform thickness of the connection layer, differences in thickness occur in the polished semiconductor wafer. In order to avoid decrease in quality of the semiconductor wafer, the cement should be removed thoroughly which may involve a complicated step. Furthermore, the semiconductor wafers may be damaged during cementing and during the removal after the polishing treatment.

It is the object of the invention to provide a method in which the above-mentioned drawbacks are avoided and in which the connection of the articles to a support can take place very effectively and by simple means. In order to reach the end in view, according to the invention, a support is used which has a connection surface in which at least one recess is present, the article is positioned on the connection surface so as to cover said recess entirely, the support and the article are placed in a space in which a sub-atmospheric pressure is produced as a result of which gas escapes from the covered recess, after which the sub-atmospheric pressure in the space is removed as a result of which the article closes the recess and is held on the connection surface of the support as a result of the sub-atmospheric pressure present in said recess.

The method according to the invention can be realized with simple means; it saves time; differences in thickness of the worked articles are avoided; damage during the connection to and the removal from the support does not occur; and cleaning treatments become simpler.

In a favourable embodiment the support has several recesses, the article covering at least two recesses entirely. The choice of a large number of recesses contributes to the deformation forces on the article being small, also during, for example, polishing, as a result of the good support of the supporting surface. The support may furthermore be used for the simultaneous connection of several articles.

According to a further embodiment a support is used of which at least the part comprising the recesses is formed from a synthetic material, for example, a synthetic rubber. Said embodiment has proved to be very favourable for maintaining the sub-atmospheric pressure in the recesses.

In order to remove the article, the support, with the article facing downwards, is provided in a space in which a sub-atmospheric pressure is produced, the article detaching from the support when the sub-atmospheric pressure is lower than the sub-atmospheric pressure in connecting the article.

The invention also relates to a support to be used in working the surface of an article. The support according to the invention is characterized in that it comprises a connection surface for the article in which at least one recess is provided, said recess forming a space which is open only at the connection surface, at least the wall of the recess being impermeable to gases.

In a particularly embodiment the recess is formed in a layer of synthetic rubber, which layer is secured to a rigid supporting element. A large number of regularly distributed recesses may be present in the connection surface.

The invention will be described in greater detail with reference to an embodiment shown in the drawing.

In the method according to the invention an article is held on a surface of a support by means of sub-atmospheric pressure. A recess in the surface of the support together with the article present above the aperture forms a closed space. The article is held on the support by means of sub-atmospheric pressure in said closed space. The article may be present above one but also above several recesses. This latter case is to be preferred in particular in connecting thin articles, in the case of several small recesses deformation of the article will be minimum and the connection surface of the article is held against the connection surface of the support in a particularly favourable manner.

The articles secured on the support may be subjected to a desired treatment. By way of example, the invention will be described in behalf of the connection of semiconductor wafers to a support which is used for polishing the semiconductor bodies. It will be obvious that other applications are also possible, for example, holding lenses in which a curved connection surface of the lens is present against a correspondingly curved surface of the support.

Figure 1:
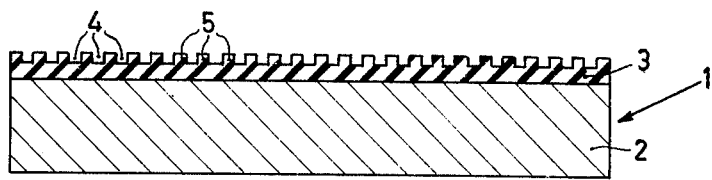
FIG. 1 is a cross-sectional view of a support for holding semiconductor wafers.
Figure 2:
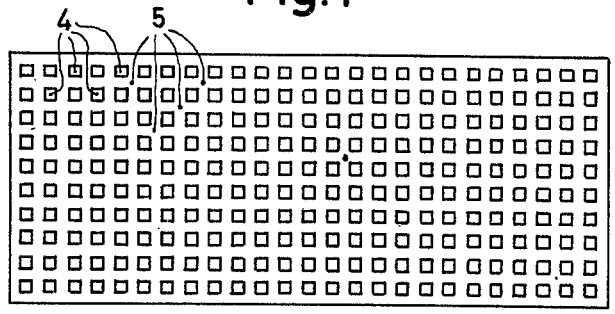
FIG. 2 is a plan view of the support shown in FIG. 1.
Figure 3:
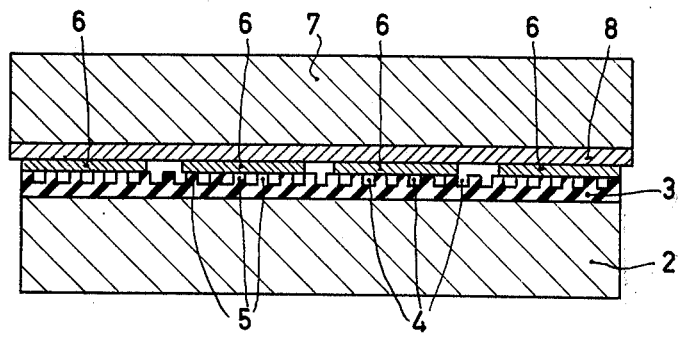
FIG. 3 shows the connection of the semiconductor wafers to the support.

FIG. 1 shows a support 1 which consists of a rigid supporting element 2 and a layer 3 which is connected thereto, for example, by means of an adhesive and in which recesses 4 are provided. The pattern of the recesses is shown in FIG. 2. The supporting element 2 is, for example, a steel block having a thickness of 1 cm or more dependent upon the application. The layer 3 may be a synthetic rubber which has a high coefficient of friction and which can withstand chemicals which are used during the treatments, for example, polishing. In the embodiment shown in which semiconductor wafers having a thickness of, for example, 250 microns are held on the support, the thickness of the layer 3 is in the order of magnitude of 3 mm. The recesses then have a depth of 1 mm and a length and width of 1.7 mm, while the portions 5 between the recesses 4 have a thickness of 0.8 mm. The upper side of the support of FIG. 1 forms the connection surface of the support.

On the connection surface of the support are positioned one or more semiconductor wafers 6 which in the example of FIG. 2 each cover a number of recesses 4. The semiconductor wafers may be loaded with a weight 7 with the interposition of a pressure-equalizing layer 8 which is permeable to gas and consists, for example, of textile, felt or a foamed synthetic material. This assembly is placed in a vacuum device not shown, for example a vacuum vessel, which is evacuated to a pressure of, for example 0.5 atmosphere. The gas present in the recesses, for example air, expands as a result of the low pressure in the vacuum device and lifts the weight 7 via the semiconductor wafers, so that gas may escape from the recesses 4 to also reduce the pressure in the recesses. The pressure in the vacuum device is now returned to atmospheric value again. The semiconductor wafers close the covered recesses and prevent the gas pressure in the recesses 4 from increasing. As a result of the sub-atmospheric pressure in the recesses the semiconductor wafers are held on the support, the connection being amply sufficient for polishing or lapping treatments after the support has been removed from the vacuum device. Since the walls of the recesses are impermeable to gas and since the semiconductor wavers close the recesses entirely, the sub-atmospheric pressure is maintained.

The use of the weight 7 is favourable in practicular in the case of light articles so as to prevent gas from leaking into the recesses along the edges of the semiconductor wafers when the gas pressure is increased again. When the articles are heavier, the weight may be omitted.

Figure 4:
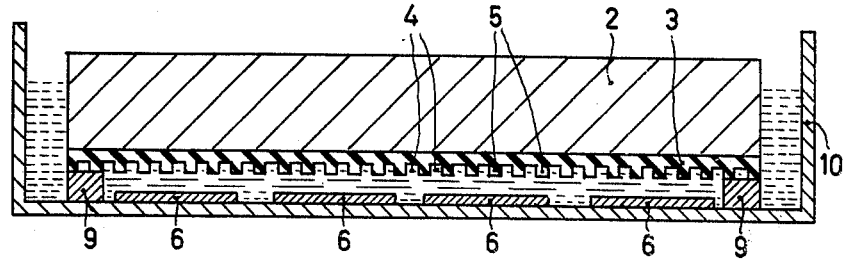
FIG. 4 shows how the semiconductor wafers are removed from the support.

FIG. 4 shows a preferred embodiment for removing the semiconductor wafers from the support after the wafers have been subjected to the desired treatment. The support 1, with the semiconductor wafers facing downwards, is positioned on spacing members 9 of a container 10. The container 10 is filled with a liquid, for example water, and the assembly is placed in a vacuum device not shown. The vacuum device is evacuated to a pressure lower than the pressure used in securing the semiconductor wafers to the support. As a result of the reduced gas pressure on the liquid, the liquid pressure against the wafers is also reduced until the semiconductor wafers automatically drop from the support to the bottom of the container 10. The liquid is only used to prevent damage to the semiconductor wafers as they drop from the support. After removing the container from the vacuum device, the semiconductor wafers are suitable for further treatments.

I claim:

1. A method of temporarily holding together facing connection surfaces of a semiconductor wafer and support for working on a surface of the wafer remote from the support, comprising the steps of:
    forming in the connection surface of the support at least one recess, said at least one recess being open only at the connection surface and having walls that are gas impermeable;
    positioning the connection surface of the semiconductor wafer against the connection surface of the support in a position to cover completely the opening of said at least one recess, thereby forming at least one closed space;
    reducing the gas pressure surrounding the support and wafer until subatmospheric gas pressure is produced in said at least one closed space; and
    bringing the gas pressure surrounding the support and wafer to atmospheric pressure to trap subatmospheric pressure in said at least one closed space and hold the wafer and support together.

2. The method defined in claim 1 characterized in that a plurality of recesses are formed in the connection surface of the support and the connection surface of the wafer covers completely the openings of a plurality of recesses.

3. The method defined in claim 2 characterized in that a plurality of semiconductor wafers are simultaneously held at different positions against the same support.

4. The method defined in claim 3 wherein the connection surface of the support and the walls of said recesses are formed of synthetic rubber.

5. The method defined in claim 4 wherein the wafers are removed from the support by again reducing the gas pressure surrounding the support and wafers.

6. The method defined in claim 5 wherein gravity automatically pulls the wafers from the support when the surrounding gas pressure is sufficiently reduced.

7. The method defined in claim 1 wherein the connection surface of the support and the walls of said at least one recess are formed of synthetic rubber.

8. The method defined in claim 1 and further characterized by the step of removing the wafer from the support at a pressure surrounding the support and wafer which is approximately the same as the subatmospheric pressure trapped in said at least one closed space.

9. The method defined in claim 8 wherein the support and held wafer are positioned such that gravity automatically removes the wafer from the support when the surrounding pressure is sufficiently reduced.

* * * * *